United States Patent [19]
Dischiano

[11] Patent Number: 6,106,367
[45] Date of Patent: Aug. 22, 2000

[54] METHOD AND DEVICE FOR ANALYSIS OF FLIP CHIP ELECTRICAL CONNECTIONS

[75] Inventor: John Dischiano, Pfugerville, Tex.

[73] Assignee: Advanced Micro Devices, Inc., Sunnyvale, Calif.

[21] Appl. No.: 09/092,533

[22] Filed: Jun. 5, 1998

[51] Int. Cl.[7] .................................................. B24B 1/00
[52] U.S. Cl. ........................................... 451/28; 451/67
[58] Field of Search .................................. 451/28, 41, 55, 451/57, 65, 67

[56] References Cited

U.S. PATENT DOCUMENTS

| | | | |
|---|---|---|---|
| 4,583,325 | 4/1986 | Tabuchi | 51/5 R |
| 5,029,418 | 7/1991 | Bull | 51/281 R |
| 5,786,701 | 7/1998 | Pedder | 324/754 |

*Primary Examiner*—Timothy V. Eley
*Assistant Examiner*—Dung Van Nguyen

[57] ABSTRACT

An alternative method and device for accessing the circuit region on a flip chip die are provided. The new method and device provide increased accuracy for accessing the electrical contacts within the circuit region. Such a method and device is necessary in order to analyze and resolve flaws among the electrical contacts between a flip chip die and the chip package. The new method and device is precise enough to avoid adding defects upon approach to the contact intended for analysis. Specific regions of the electrical contact can be isolated for study. The technique is equally efficient for mass fabrication design testing and analysis.

19 Claims, 2 Drawing Sheets

METHOD AND DEVICE FOR ANALYSIS OF FLIP CHIP ELECTRICAL CONNECTIONS

RELATED APPLICATIONS

This application is related to the co-filed and commonly assigned application entitled "An Alternate Method and Device for Analysis of Flip Chip Electrical Connections," U.S. patent application Ser. No. 09/092,446, which is hereby incorporated by reference.

FIELD OF THE INVENTION

The invention relates to semiconductor device assemblies, and more particularly to techniques for analyzing and debugging circuitry associated with a flip chip bonded integrated circuit.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

Flip chip technology answers the demand for improved input/output (I/O) connections from the chip to external systems. On a flip chip, the electrical components are located (face down) on the side of the die which attaches to the chip package. In this manner, the flip chip provides a short interconnection length using, for example, ball-grid array (BGA) solder connections. The self-aligning nature of the solder bumps offers the advantages of higher density mounting, improved electrical performance and reliability, and better manufacturability. The positioning of the circuit side is the source of many advantages in the flip chip design. However, in other regards, the orientation of the die with the circuit side face down on a substrate is a disadvantage.

In example, access to the circuit region is necessitated in order to modify or debug a finished chip. Additionally, access to the circuit region is often desired through manufacturing stages in order to test and analyze the circuit's integrity. In this event, it is necessary to cut through the body of the flip chip die or through the chip package in order to access the circuit region.

Various methods have been employed to access the circuit region. A popular method includes milling or grinding off portions of the die, or the chip packaging in order to access the circuit region. This method is not adequate, however, for all circuit testing purposes. The difficulty resides in the accuracy of this method as well as the wear the technique places on the circuit region. An example is provided with the need to study the quality of the electrical contacts in the circuit region or, conversely, to resolve the source of contact problems. A great deal of precision is needed to access specific regions of the contact. Fast milling simply is too rough a technique and may even add defects to the contact in the approach. When this happens it may be impossible to uncover the original flaw in the contact. Also, slow milling techniques are simply too inefficient for mass fabrication design testing and analysis.

For these reasons, it is necessary to uncover an alternative method and device for accessing the circuit region on a flip chip die. More specifically, an alternative method and device are needed to access and study the electrical contacts between the flip chip die and the chip package. The new method and device must avoid adding defects to the regions intended for analysis.

SUMMARY OF THE INVENTION

The above mentioned problems with integrated circuit technology and other problems are addressed by the present invention and will be understood by reading and studying the following specification. A device and method are described which accord these benefits.

In particular, an illustrative embodiment of the present invention includes a method for accessing a circuit region on a flip chip die mounted on a chip package. The method includes removing a first portion of the flip chip die and the chip package. The flip chip die has a number of electrical connections to the chip package in the circuit region. A second portion of the flip chip die and the chip package is attached to a tool. At least one of the number of electrical connections in the second portion is then accessed.

In another embodiment, a device for accessing a circuit region on a flip chip die mounted on a chip package is provided. The device includes a tool. A portion of the flip chip die and the chip package is attached to the tool. The chip package has a number of electrical connections to the circuit region. The portion of the flip chip die and the chip package includes an exposed cross section of the circuit region.

In another embodiment, a system for accessing a circuit region on a flip chip die mounted on a chip package is provided. The system includes the device presented above as well as a controller. The controller is electrically coupled to the tool of the device in order to control its operation.

Thus an alternative method and device for accessing the circuit region on a flip chip die are provided. The new method and device provide increased accuracy for accessing the electrical contacts within the circuit region. Such a method and device is necessary in order to analyze and resolve flaws among the electrical contacts between a flip chip die and the chip package. The new method and device is precise enough to avoid adding defects upon approach to the contend intended for analysis. Specific regions of the electrical contact can be isolated for study. The technique is equally efficient for mass fabrication design testing and analysis.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The terms "front," "back," "front side," and "back side" as used in this application may be interchanged and are used principally to suggest a structural relationship with respect to one another. The term "horizontal" is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the structure discussed, regardless of the orientation of the structure.

FIGS. 1A–1D describe generally various steps of an embodiment for accessing the circuitry of a flip chip.

Figure 1A:
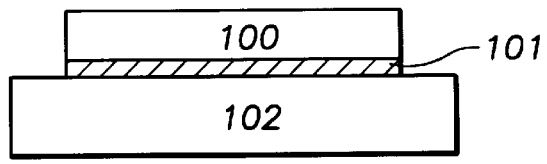
FIGS. 1A–1D show cross-sectional views of successive process steps for accessing a circuit region of a flip chip die mounted on a chip package according to the present invention.

In FIG. 1A, the starting structure is illustrated. The structure includes a flip chip die 100. The flip chip die 100 includes a circuit region 101 located on a front side 103 of the flip chip die 100. The flip chip die 100 is attached to a chip package 102. The flip chip die 100 is oriented such that the circuit region 101 is adjacent to, or "faces," the chip package 102. In one embodiment, the chip package 102 is formed from ceramic. In another embodiment, the chip package 102 is formed from any suitable material for supporting and protecting the flip chip die 100 as well as facilitating electrical connections to the circuit region 101. In one embodiment, the circuit region 101 is electrically connected to the chip package using a ball grid array (BGA) technique, as this method is well practiced in the art. According to this method, the electrical contacts are solder bumps. In an alternative embodiment, the circuit region 101 of the flip chip die 100 is electrically connected using any other suitable method. Such alternative methods are well known and practiced by those skilled in the art.

Figure 1B:
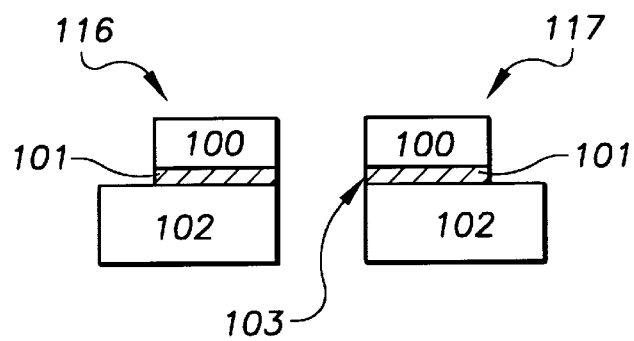

FIG. 1B illustrates the structure following the next sequence of events. The flip chip die 100 and the attached chip package 102 are cut in two. The severing divides the flip chip die 100 and the attached chip package into a first portion 116 and a second portion 117. In one embodiment, removing the first portion of the flip chip die 116 from the second portion 117 is achieved using a diamond saw to severe the original piece. Removing the first portion 116 of the flip chip die 100 and the attached chip package 102 exposes a cross-section 103 of the circuit region 101. In one embodiment, the first portion 116 of the flip chip die 100 and the attached chip package 102 were cut away from within 150 micrometers ($\mu$m) of at least one of the number of electrical connections in the circuit region 101 of the second portion 117. The structure is now as appears in FIG. 1B.

Figure 1C:
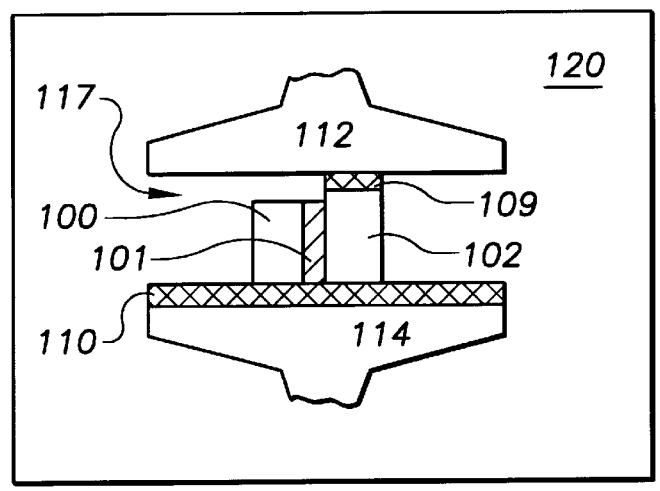

FIG. 1C illustrates the structure following the next series of steps. The second portion 117 including the flip chip die 100, circuit region 101, and the attached chip package 102 are attached to a tool 120. The second potion 117 including the flip chip die 100 and the attached chip package is attached to the tool 120 using an adhesive wax 109 that is removable upon heating. The tool 120 may be any device analysis tool as the same are commonly known and used by those working in the semiconductor device analysis field. In one embodiment, the first tool 120 is a circuit accessing tool adapted for milling, or polishing, off material from the second portion 117 of the flip die 100 and the attached chip packages 102. Circuit accessing tools include polishing tools which are commercially available in the industry. The tool 120 includes a holder 112 and a polishing blade 110 mounted onto a polishing bit 114. The polishing blade 110 opposes the holder 112. Additional material is removed from the exposed cross-section 103 of the second portion 117 by the operation of the polishing blade 110. In one embodiment, removing the additional material includes a first polishing step in which a first grade polishing blade is used, a second step in which a second grade polishing blade is used, and a third step in which a third polishing blade is used. In one embodiment, the additional material is removed by using different speeds of revolution for the polishing blade 110.

Figure 1D:
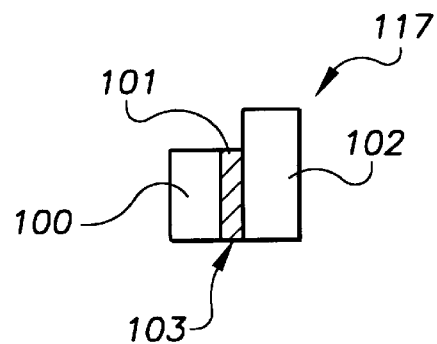

FIG. 1D illustrates the second portion 117 once it has been removed from the tool 120. Additional material from the exposed cross-section 103 of circuit region 101 has now been removed to expose at least one of the number of electrical contacts in the circuit region 101 for further analysis.

Figure 2:
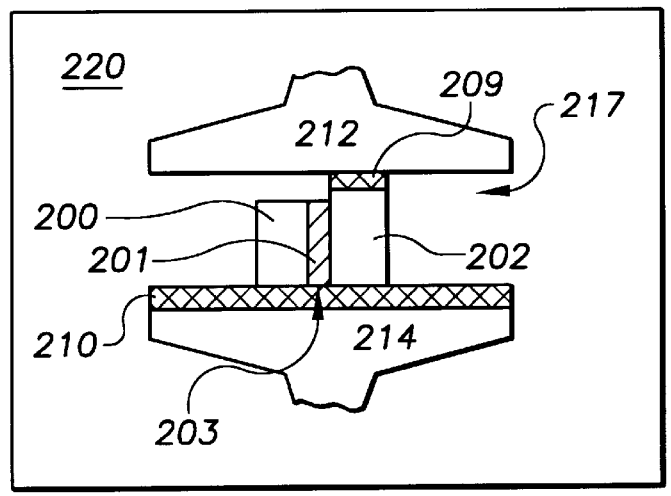
FIG. 2 illustrates a device for accessing a circuit region of a flip chip die mounted on a chip package according to the present invention.

The present invention includes numerous variations to the embodiment described above. FIG. 2 illustrates a device for accessing flip chip circuitry according to the present invention. The device includes a portion 217 of a flip chip die 200 and chip package 202. The portion 217 of the flip chip die 200 includes a circuit region 201. The portion 217 of the flip chip die 200 is oriented such that the circuit region 201 is adjacent to, or "faces," a chip package 202. The chip package 202 has electrical connections to a circuit region 201 on flip chip die 200. In one embodiment, the circuit region 201 is electrically connected to the chip package using a ball grid array (BGA) technique, as this method is well practiced in the art. In an alternative embodiment, the circuit region 201 of the flip chip die 200 is electrically connected using any other suitable method. Such alternative methods are well known and practiced by those skilled in the art. In one embodiment, the chip package 202 is formed from ceramic. In another embodiment, the chip package 202 is formed of any suitable material for supporting and protecting the flip chip die 200 as well as facilitating the electrical connections between the circuit region 201 and the chip package 202. The portion 217 of the flip chip die 200 and chip package 202 further includes an exposed cross-section 203 to the circuit region 201.

The portion 217 of a flip chip die 200 and chip package 202 is attached to a tool 220. The portion 217 including the flip chip die 200 and the attached chip package 202 is attached to the tool 220 using an adhesive wax 209 that is removable upon heating. The tool 220 may be any device analysis tool as the same are commonly known and used by those working in the semiconductor device analysis field. In one embodiment, the tool 220 is a circuit accessing tool adapted for milling, or polishing, off material from the portion 217 of the flip die 100 and the attached chip packages 102. Circuit accessing tools include polishing tools which are commercially available in the industry. The tool 220 includes a holder 212 and a polishing blade 210 mounted onto a polishing bit 214. In one embodiment, the polishing blade 210 includes a diamond disc. In an alternative embodiment the polishing blade 210 includes a nylon cloth. In yet another embodiment, the polishing blade 210 includes a diamond film. The polishing blade 210 opposes the holder 212.

Additional material is removed from the exposed cross-section 203 of the portion 217 by the operation of the polishing blade 210. In one embodiment, the exposed cross-section 203 includes at least one cross-section of a solder bump. In another embodiment, the exposed cross-section 203 is within 150 μm of an electrical contact.

Figure 3:
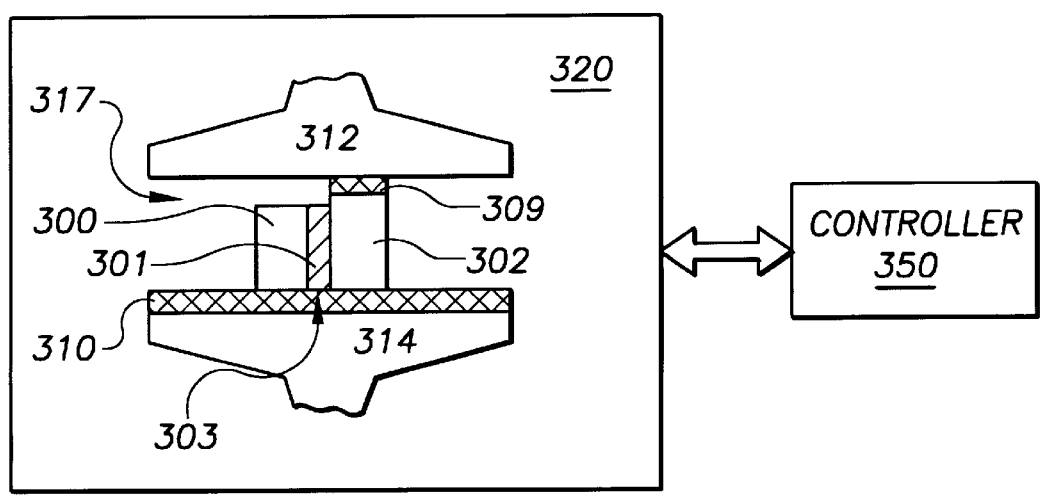
FIG. 3 is a block diagram of a system in accordance with an embodiment of the present invention.

FIG. 3 is a block diagram of a system in accordance with an embodiment of the present invention. FIG. 3 illustrates a controller 350. By way of example, the controller includes an electrical controller. In one embodiment, the controller 350 includes a micro controller as the same are readily accessible for industry needs. In another embodiment, the controller includes a central processing unit (CPU) as part of a computer operated tool configuration. Other types of controllers are well known to those in the art and would be equally suited for use in the present invention. The controller 350 is electrically coupled to a tool 320 and suited for controlling the operation of the tool 320. The tool 320 includes the embodiments presented above in connection with FIG. 2.

Further, the system includes a portion 317 of a flip chip die 300 and chip package 302. The portion 317 of the flip chip die 300 includes a circuit region 301. The portion 317 of the flip chip die 300 is oriented such that the circuit region 301 is adjacent to, or "faces," a chip package 302. The chip package 302 has electrical connections to a circuit region 301 on flip chip die 300. In one embodiment, the circuit region 301 is electrically connected to the chip package using a ball grid array (BGA) technique, as this method is well practiced in the art. In an alternative embodiment, the circuit region 301 of the flip chip die 300 is electrically connected using any other suitable method. Such alternative methods are well known and practiced by those skilled in the art. In one embodiment, the chip package 302 is formed from ceramic. In another embodiment, the chip package 302 is formed of any suitable material for supporting and protecting the flip chip die 300 as well as facilitating the electrical connections between the circuit region 301 and the chip package 302. The portion 317 to the flip chip die 300 and chip package 302 further includes an exposed cross-section 303 to the circuit region 301.

Thus, the present invention provides an alternative method and device for accessing the circuit region on a flip chip die. The new method and device provide increased accuracy for accessing the electrical contacts within the circuit region. Such a method and device is necessary in order to analyze and resolve flaws among the electrical contacts between a flip chip die and the chip package. The new method and device is precise enough to avoid adding defects upon approach to the contact intended for analysis.

Although specific embodiments have been illustrated and described herein, it is appreciated by those of ordinary skill in the art that any arrangement which is calculated to achieve the same purpose may be substituted for the specific embodiments shown.

Therefore, it is manifestly intended that this invention be limited only by the claims and the equivalents thereof.

What is claimed is:

1. A method for accessing a circuit region on a flip chip die mounted on a chip package, the method comprising:

removing a first portion of the flip chip die and the chip package, the flip chip die having a number of electrical connections to the chip package in the circuit region;

attaching a second portion of the flip chip die and the chip package to a die reduction tool; and accessing at least one of the number of electrical connections in the second portion.

2. The method of claim 1, wherein attaching the second portion to a tool comprises attaching the second portion to a holder component on the tool, the tool further including a polishing blade, the polishing blade opposing the holder.

3. The method of claim 1, wherein removing a first portion of the flip chip die and the chip package comprises using a diamond saw to remove a first portion of the flip chip die and the chip package.

4. The method of claim 1, wherein removing a first portion of the flip chip die and the chip package comprises exposing a cross-section of the circuit region.

5. The method of claim 1, wherein attaching a second portion to the tool comprises using an adhesive wax that is removable upon heating.

6. The method of claim 1, wherein removing the first portion of the flip chip die and the chip package comprises cutting away the first portion of the flip chip die and the chip package to within 150 micrometers (μm) of the at least one of the number electrical connections in the second portion.

7. The method of claim 1, wherein accessing the at least one of the number of electrical connections comprises accessing a solder bump.

8. The method of claim 1, wherein accessing the at least one of the number of electrical connections comprises using a polishing tool to remove additional material from the second portion of the flip chip die and the chip package.

9. The method of claim 1, wherein the step of accessing comprises polishing off portions of the chip package at different rates.

10. The method of claim 1, wherein accessing the at least one of the number of electrical connections comprises:

a first step of polishing a portion of the die;

a second step of polishing a portion of the die; and a third step of polishing a portion of the die.

11. The method of claim 10, wherein the first polishing step comprises using a first grade polishing blade, wherein the second polishing step comprises using a second grade polishing blade, and wherein the third polishing step comprises using a third grade polishing blade.

12. An arrangement for accessing a circuit region on a flip chip die mounted on a chip package, comprising:

a die reduction tool; and a portion of the flip chip die and the chip package, the chip package having a number of electrical connections to the circuit region, wherein the portion of the flip chip die and the chip package includes an exposed cross section of the circuit region within 150 microns of an electrical contact, the portion of the flip chip die and the chip package attached to the tool.

13. The arrangement of claim 12, wherein the tool comprises:

a holder, the holder holding the portion of the flip chip die and the chip package;

a polishing blade, the polishing blade opposing the holder; and a polishing bit, the polishing bit holding the polishing blade.

14. The arrangement of claim 13, wherein the polishing blade is a diamond disc.

15. The arrangement of claim 13, wherein the polishing blade is a nylon cloth.

16. The arrangement of claim 13, wherein the polishing blade is a diamond film.

17. The arrangement of claim 12, wherein the number of electrical connections comprises a ball grid array (BGA).

18. The arrangement of claim 12, wherein the exposed cross section includes at least one cross section of a solder bump.

19. A system for accessing a circuit region on a flip chip die mounted on a chip package, comprising:

a device for accessing the circuit region, the device comprising:

a die reduction tool; and a portion of the flip chip die and the chip package, the chip package having a number of electrical connections to the circuit region, wherein the portion of the flip chip die and the chip package includes an exposed cross section of the circuit region, the portion of the flip chip die and the chip package attached to the tool; and a controller electrically coupled to the tool for controlling the operation of the tool.

* * * * *

UNITED STATES PATENT AND TRADEMARK OFFICE
CERTIFICATE OF CORRECTION

PATENT NO. : 6,106,367 Page 1 of 1
DATED : August 22, 2000
INVENTOR(S) : Dischiano It is certified that error appears in the above-identified patent and that said Letters Patent is hereby corrected as shown below:

<u>Title page,</u>
Item [75], the inventor's city should read -- Pflugerville --.

Signed and Sealed this

Eighteenth Day of February, 2003

JAMES E. ROGAN
*Director of the United States Patent and Trademark Office*